United States Patent [19]

Singh

[11] Patent Number: 4,862,112

[45] Date of Patent: Aug. 29, 1989

[54] W-BAND MICROSTRIP OSCILLATOR USING GUNN DIODE

[75] Inventor: Donald R. Singh, Minneapolis, Minn.

[73] Assignee: Honeywell, Inc., Minneapolis, Minn.

[21] Appl. No.: 158,702

[22] Filed: Feb. 22, 1988

[51] Int. Cl.[4] .............................................. H03B 9/14
[52] U.S. Cl. .............................. 331/107 SL; 331/99;
331/107 G; 333/247
[58] Field of Search ...................... 331/96, 99, 107 SL,
331/107 G, 107 DP; 333/247, 250

[56] References Cited

U.S. PATENT DOCUMENTS

| | | | |
|---|---|---|---|
| 3,668,554 | 6/1972 | Dupre | 331/107 SL |
| 3,680,002 | 7/1972 | Quine | 331/96 |
| 3,868,594 | 2/1975 | Cornwell et al. | 331/107 SL X |
| 3,986,153 | 10/1976 | Kuno et al. | 331/96 X |
| 4,005,372 | 1/1977 | Ho et al. | 331/107 SL |
| 4,222,014 | 9/1980 | Ondria | 331/107 DP |
| 4,232,277 | 11/1980 | Dickens et al. | 331/107 SL X |
| 4,246,550 | 1/1981 | Cohen | 331/107 DP |
| 4,445,097 | 4/1984 | Godart et al. | 331/117 D |
| 4,488,124 | 12/1984 | Yoshimura | 331/107 DO |
| 4,494,086 | 1/1985 | Dydyk | 331/96 |
| 4,494,087 | 1/1985 | Dydyk et al. | 331/107 DP |
| 4,511,860 | 4/1985 | Bastida et al. | 331/96 |
| 4,514,707 | 4/1985 | Dydyk et al. | 331/107 SL |
| 4,591,806 | 5/1986 | Havens | 331/107 DP |

OTHER PUBLICATIONS

Gough et al, "An Integrated Wide-Band Varactor-Tuned Gunn Oscillator", IEEE Trans. Electron Devices, vol. ED-20, No. 10, Oct., 1973, pp. 863-865.

*Primary Examiner*—Siegfried H. Grimm
*Attorney, Agent, or Firm*—Orrin M. Haugen; Thomas J. Nikolai; Frederick W. Niebuhr

[57] ABSTRACT

A microstrip oscillator utilizing a Gunn diode as its active element for operation in the W-Band. A microstrip shunt resonator is dimensioned to resonate the Gunn diode at either its fundamental frequency or second harmonic frequency while a matching circuit, including a quarter wavelength transformer and a coupled microstrip transformer is employed to match the complex impedance of the Gunn diode device to the load. A radial hat on the Gunn diode effectively prevents radiation of electromagnetic energy from the system to thereby maximize the energy delivered to the load while, at the same time, functioning as a transformer element.

5 Claims, 2 Drawing Sheets

W-BAND MICROSTRIP OSCILLATOR USING GUNN DIODE

BACKGROUND OF THE INVENTION

I. Field of the Invention

This invention relates generally to the design of an integrated circuit oscillator and more particularly to an integrated circuit oscillator capable of operation in the W-Band (75-110 GHz).

II. Discussion of the Prior Art

Prior art oscillators designed for operation in the W-Band typically have been fabricated using a Gunn diode in combination with a waveguide. Such devices tend to be overly large and bulky for many applications. Thus, it is desirable to have a W-Band oscillator which combines the properties of being small in size, light in weight, easily and repeatedly manufacturable and highly reliable.

The present invention achieves these ends by utilizing microstrip technology along with a Gunn diode to create a W-Band oscillator. The Gunn diode, when appropriately biased, exhibits a negative resistance region over a substantial range of frequencies. When coupled in shunt with a microstrip resonator and when properly matched to the load from an impedance standpoint, via microstrip transformers, the oscillator can be made to oscillate in the fundamental mode or the harmonic mode, depending upon the type of semiconductor compound employed in the Gunn diode element, to deliver power to the load with high efficiency.

SUMMARY OF THE INVENTION

In accordance with the present invention, a dielectric substrate exhibiting low loss and low dispersion has a conductive ground plane on one major surface thereof and an etched pattern of conductive strips on the opposed major surface. An aperture is formed through the ground plane and substrate and fitted through this aperture is the pile portion of a packaged Gunn diode device of either GaAs or InP type. External connections between the terminals of the packaged Gunn diode and the microstrip conductors are made utilizing conductive straps.

The above-described circuit is enclosed in a narrow rectangular channel and placed within a conductive housing. The dimensions of the channel are selected to be sufficiently small to prevent propagation of higher order modes, and the channel is shielded by a conducting cover to eliminate radiation losses.

The complex impedance of the Gunn diode device is matched to a 50 ohm microstrip transmission line by a combination of a microstrip shunt resonator, a two section microstrip matching transformer and a radial hat attached to the cap of the Gunn diode. By controlling the length of the microstrip shunt resonator, the frequency of the oscillator may be established within defined limits. The d.c. bias connection to the circuit is made via a two section, quarter wave bias filter connected to one of the transformers. A coupled line section, which forms one of the transformers, serves as a d.c. block.

OBJECTS

It is accordingly a principal object of the present invention to provide an improved oscillator design for use at W-Band frequencies.

Another object of the invention is to provide a high frequency oscillator utilizing microstrip technology.

Yet another object of the invention is to provide a W-Band frequency oscillator utilizing a Gunn diode as the active element and a microstrip circuit for resonating the reactance of the Gunn diode and for effectively matching the resistive component of the load to the negative resistance of the Gunn diode device.

The foregoing objects and advantages of the invention will become apparent to those skilled in the art from the following detailed description of a preferred embodiment, especially when considered in conjunction with the accompanying drawings in which like numerals in the several views refer to corresponding parts.

DESCRIPTION OF THE PREFERRED EMBODIMENT

Figure 1:
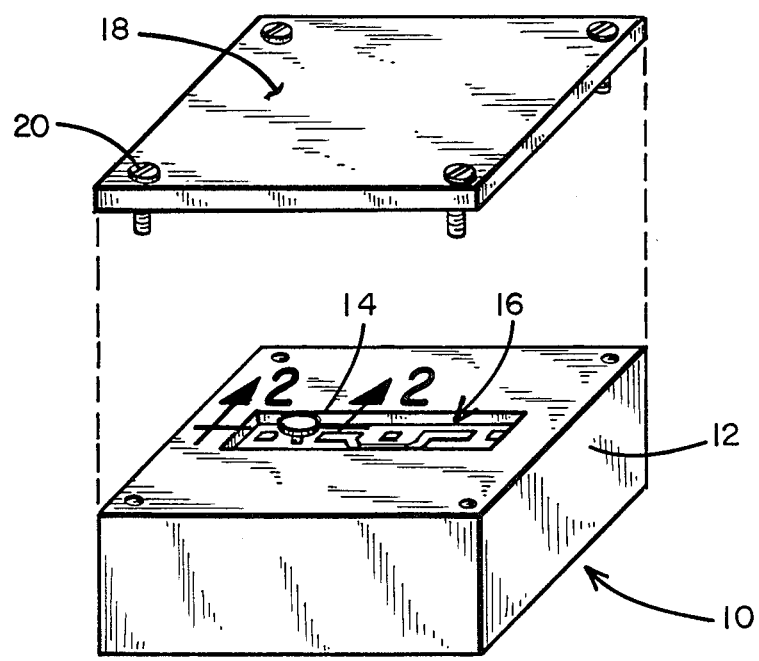
FIG. 1 is a perspective drawing of the oscillator in accordance with the present invention.

Referring to FIG. 1, there is shown a preferred mechanical packaging arrangement for the W-Band microstrip oscillator of the present invention. It is indicated generally by numeral 10 and is seen to include a heat sink in the form of a block 12 of a suitable thermally-conductive material, such as brass or gold-plated brass. Formed in the upper surface thereof is a generally rectangular channel or recess 14 in which the microstrip oscillator of the present invention is contained. This microstrip is indicated generally by numeral 16 in the view of FIG. 1. A cover 18, also made from a conductive metal, such as brass or gold-plated brass, is arranged to be affixed, as by screws 20, to the heat sink block 12 and, when in place, effectively confines the high frequency signals generated by the oscillator from radiating from the package and also protects the circuitry from environmental damage.

Figure 2:
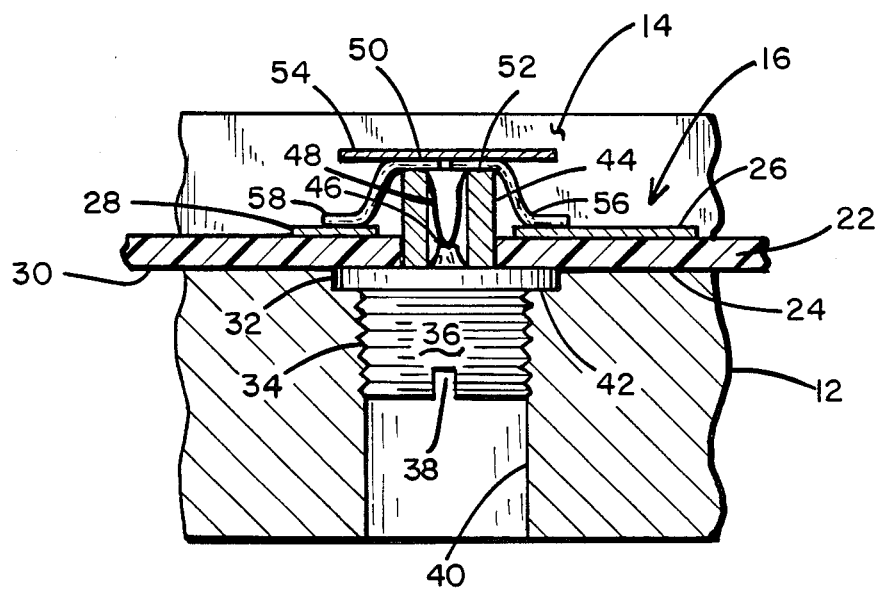
FIG. 2 is a cross-sectional view taken along the lines 2—2 in FIG. 1.

FIG. 2 is a greatly enlarged view of a portion of the assembly of FIG. 1 taken along the lines 2—2 in FIG. 1. As can be seen from this view, a microstrip circuit, comprising a dielectric substrate 22 having a ground plane 24 bonded to a first major surface thereof and an etched pattern of conductors, as at 26 and 28, on the opposed major surface, rests on the bottom surface 30 of the channel 14.

Formed inwardly from the base 30 of the channel 14 is a circular recess 32 and a threaded bore 34 into which is screwed a packaged Gunn diode 36. The package is conventional and includes a slot 38 in the base thereof for receiving a screwdriver tip insertable through the bore 40 formed inwardly from the undersurface of the heat sink block 12. The base of the device comprises its cathode electrode. The package diode 36 also has a circular flange 42 which fits within the recess 32 and a cylindrical ceramic pile 44 extends upwardly from the flange member 42 to pass through an aperture provided in the substrate 22.

Contained within the cylindrical ceramic pile 44 is a chip of an appropriate semiconductor compound which may, in one arrangement, be gallium arsenide (GaAs) or in an alternative device indium phosphide (InP). This semiconductor chip is identified by numeral 46 and internal conductive ribbons as at 48 are used to join the semiconductor material to the diode,s anode terminals 50 and 52 which are joined together by a conductive cap. Disposed atop the packaged Gunn diode is a conductive circular plate termed a "radial hat" it is and identified by numeral 54. The purpose and function of the radial hat will be explained hereinbelow. Connections between the diode terminals 50 and 52 and the etched conductive patterns 26 and 28 are achieved using conductive straps 56 and 58 which are soldered in place resulting in a planar configuration of the Gunn diode and the attendant microstrip circuitry.

Figure 3:
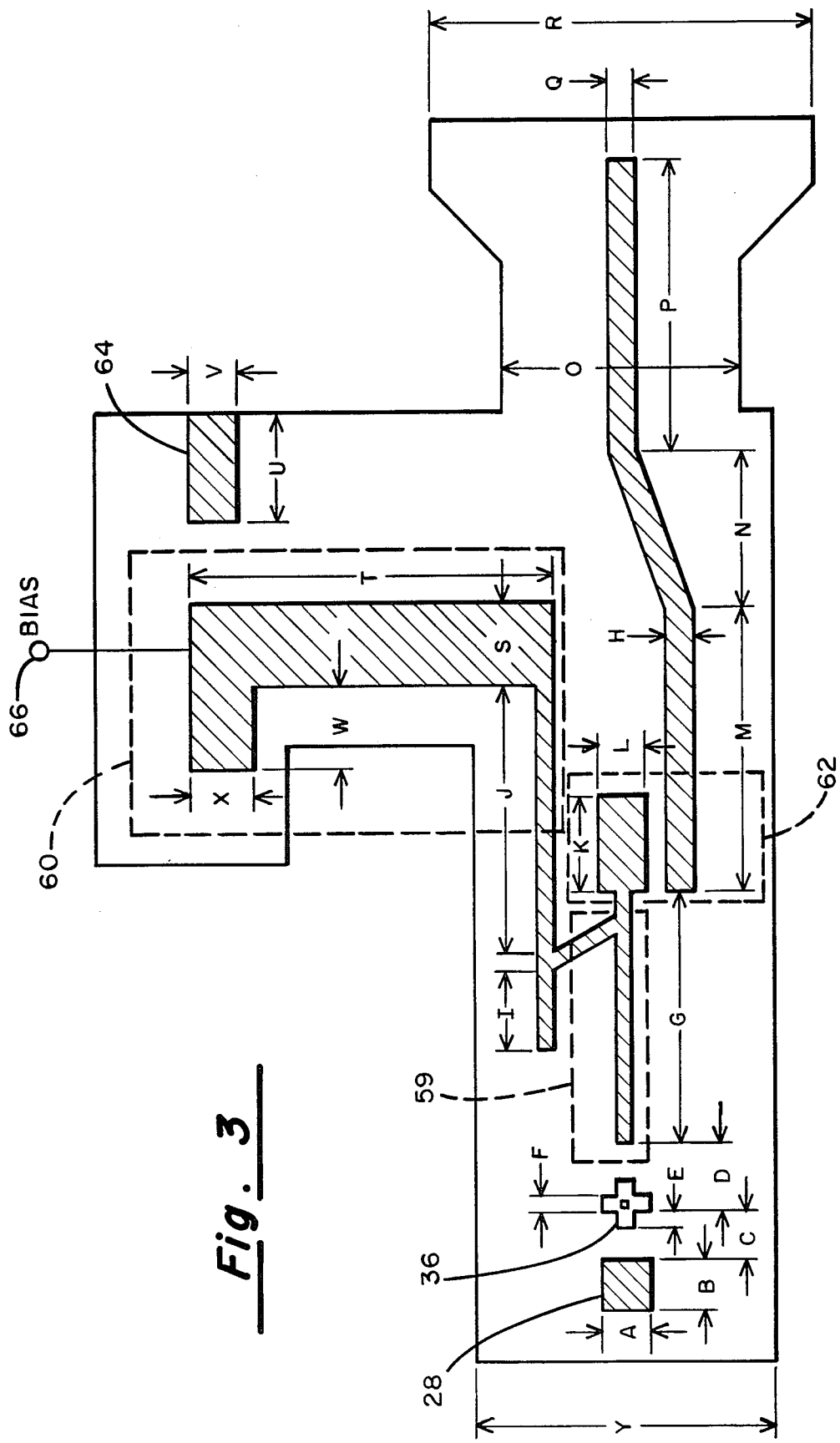
FIG. 3 is a greatly enlarged plan view of the circuit showing the metallization pattern comprising the microstrip circuit.

Reference is next made to the plan view of FIG. 3 which shows in greatly enlarged form the conductive patterns forming the microstrip circuit. In this view, only the etched pattern side of the substrate 22 can be viewed. The pattern is seen to include a rectangular patch 28 which functions as a shunt resonator and is connected to the anode of the Gunn diode 36 by the conductive strip 58 (FIG. 2).

The conductive strap 56 in FIG. 2 connects the other terminal of the Gunn diode to a quarter wave transformer element which is shown enclosed by a broken line box 59. This quarter wave transformer couples the Gunn diode 36 to a d.c. bias network enclosed by broken line box 60 and, in this fashion, the W-Band RF energy is effectively blocked from the d.c. bias circuit.

Broken line box 62 encloses a portion of the microstrip circuitry which functions as a coupled line transformer. This RF coupling transformer feeds the high frequency oscillator output to the load while acting as a block for d.c. bias current. The dimensions of the metallization comprising the coupled line transformer and the spacing between adjacent segments is designed such that at the operating frequency, the effective complex impedance of the Gunn diode device will be matched to a pure resistive load with the real and reactive components of the device impedance and the load impedance being complex conjugates of one another.

By positioning the patch 64 adjacent a portion of the d.c. bias network 60, a RF capacitor is effectively created for further shunting out any RF energy from the d.c. bias circuit which is arranged to be connected to the bias terminal 66.

As those skilled in the art are aware, under normal operating conditions, a Gunn diode device exhibits a negative resistance characteristic over a wide range of frequencies and signal amplitudes. Oscillations will occur when the real part of the Gunn device impedance is greater than the external load resistance and the imaginary part of the Gunn device impedance is a conjugate match to that of the circuit impedance. The operating frequency of the device is principally controlled by the configuration of the microstrip circuitry and the parasitic inductance and capacitance of the packaged Gunn diode itself.

As can be observed in FIG. 3, the microstrip resonator 28 is connected in shunt with the Gunn diode 36 and a radial hat 54 (FIG. 2) is attached to the diode cap. A two-section transformer including a quarter wave transformer contained within the broken line box 59 and a coupled line transformer shown enclosed by box 62, is used to accomplish impedance matching between the diode and the load as well as blocking of RF energy from the d.c. bias circuitry.

By using a InP Gunn diode, a W-Band microstrip oscillator can be tuned to operate at a fundamental frequency of 94 GHz. The frequency can be made to vary from this nominal value by either adjusting the length dimension of the shunt resonator 28 or by changing the bias applied to the Gunn diode. The oscillator of the present invention demonstrates a maximum power output of 35 mW at a 92 GHz frequency. The amount of power delivered to the load is, to a significant extent, a function of the diameter of the radial hat 54.

In an embodiment where GaAs is used as the semiconductor portion of the packaged Gunn diode, the Gunn diode may be operated at its fundamental frequency (47 GHz) by proper dimensioning of the shunt resonator 28 and the radial hat 54. Then, the matching circuit, including the quarter-wave transformer within broken line box 59 and the coupled line transformer in box 62, should operate to match the diode impedance to the load at the second harmonic which is 94 GHz.

In implementing a W-Band microstrip oscillator using a packaged GaAs Gunn diode, the microstrip circuitry may be dimensioned as follows:

| | | | |
|---|---|---|---|
| A | 22 mils | M | 124 mils |
| B | 19 mils | N | 100 mils |
| C | 20 mils | O | 55 mils |
| D | 19 mils | P | 172 mils |
| E | 10 mils | Q | 17 mils |
| F | 5 mils | R | 110 mils |
| G | 77 mils | S | 40 mils |
| H | 15 mils | T | 200 mils |
| I | 24 mils | U | 32 mils |
| J | 180 mils | V | 41 mils |
| K | 26 mils | W | 46 mils |
| L | 15 mils | X | 41 mils |
| | | Y | 66 mils |

In this illustrative embodiment, the substrate may be a five mil thick CuFlon TM substrate which is found to exhibit a low loss characteristic at millimeter frequencies and is less expensive than the traditional quartz substrate.

While I have described a preferred embodiment of the invention, it will be understood that the invention is to be limited only by the scope of the following claims.

What is claimed is:

1. A microstrip oscillator for providing high frequency power to a load comprising, in combination:
    (a) a packaged Gunn diode having first and second terminals and exhibiting a negative resistance characteristic over a predetermined frequency range;
    (b) a planar dielectric substrate having a metallic ground plane on one major surface thereof and a pattern of conductive strips on the other major surface thereof, said conductive strips defining
        (i) a quarter-wave shunt microstrip resonator,
        (ii) a microstrip quarter-wave transformer,
        (iii) a microstrip coupled line transformer,
        (iv) a d.c. bias network, and
        (v) an output microstrip line;
    (c) means for mounting said Gunn diode in generally co-planar relationship on said dielectric substrate; and
    (d) means for coupling said first terminal of said Gunn diode to said shunt resonator and to said d.c. bias network and said second terminal of said Gunn diode to said ground plane, said quarter-waver transformer and said coupled line transformer being disposed between said first terminal of said Gunn diode and said output line for isolating the d.c. bias voltage applied to said bias network from the high frequency signals on said output line while matching the impedance of said Gunn diode to said load connected to said output line.

2. The microstrip oscillator as in claim 1 and further including a conductive housing having a channel formed therein for containing said dielectric substrate and said packaged Gunn diode, said housing including a threaded bore communicating with said channel.

3. The microstrip oscillator as in claim 2 wherein said means for mounting said Gunn diode includes an aperture formed through the thickness dimension of said substrate and said ground plane, the diameter of said aperture being of a size to receive a first portion of said packaged Gunn diode therethrough when a second portion of said Gunn diode is screwed into said threaded bore in said housing.

4. The microstrip oscillator as in claim 1 wherein the frequency of oscillation of said oscillator is determined by the dimensions of said shunt resonator.

5. The microstrip oscillator as in claim 1 and further including a radial hat comprising a circular conductive plate bonded to said first terminal and extending parallel to said substrate for influencing the power delivered from said microstrip oscillator to said load without affecting the frequency.

* * * * *

UNITED STATES PATENT AND TRADEMARK OFFICE
CERTIFICATE OF CORRECTION

PATENT NO.   :  4,862,112
DATED        :  August 29, 1989
INVENTOR(S)  :  Donald R. Singh It is certified that error appears in the above-identified patent and that said Letters Patent is hereby corrected as shown below:

Column 4, line 63, change "quarter-waver" to -- quarter-wave --.

Signed and Sealed this

Seventh Day of August, 1990

Attest:

HARRY F. MANBECK, JR.

*Attesting Officer*          *Commissioner of Patents and Trademarks*